(12) United States Patent
Zhang et al.

(10) Patent No.: US 10,127,855 B2
(45) Date of Patent: Nov. 13, 2018

(54) ARRAY SUBSTRATE, ITS MANUFACTURING METHOD, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ming Zhang, Beijing (CN); Huaxing Zu, Beijing (CN); Yinzhong Zhang, Beijing (CN); Zhaohui Hao, Beijing (CN); Xiongxuan Yin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 189 days.

(21) Appl. No.: 14/429,618

(22) PCT Filed: Jun. 9, 2014

(86) PCT No.: PCT/CN2014/079448
§ 371 (c)(1),
(2) Date: Mar. 19, 2015

(87) PCT Pub. No.: WO2015/062273
PCT Pub. Date: May 7, 2015

(65) Prior Publication Data
US 2016/0063912 A1    Mar. 3, 2016

(30) Foreign Application Priority Data

Oct. 31, 2013 (CN) .......................... 2013 1 0530006

(51) Int. Cl.
*G09G 3/20* (2006.01)
*H01L 27/12* (2006.01)
(Continued)

(52) U.S. Cl.
CPC ......... *G09G 3/2092* (2013.01); *G02F 1/1345* (2013.01); *H01L 27/124* (2013.01);
(Continued)

(58) Field of Classification Search
CPC ........ A24D 1/027; A24D 3/041; B05B 5/032; H01L 27/12; H01L 21/4766;
(Continued)

(56) References Cited

U.S. PATENT DOCUMENTS 7,514,713 B2 * 4/2009 Tsai ................... G02F 1/1345
257/208
7,893,436 B2 * 2/2011 Kim .................. G02F 1/1345
257/59
(Continued)

FOREIGN PATENT DOCUMENTS

CN           1512251 A      7/2004
CN        101086995 A     12/2007
(Continued)

OTHER PUBLICATIONS

Second Office Action regarding Chinese application No. 201310530006.5, dated Jan. 4, 2016. Translation provided by Dragon Intellectual Property Law Firm.
(Continued)

*Primary Examiner* — Lan Vinh
(74) *Attorney, Agent, or Firm* — Harness, Dickey & Pierce, P.L.C.

(57) ABSTRACT

The array substrate according to the present disclosure may include within its fanout region a plurality of signal transmission lines for transmitting signals between a driver chip and a display region of the array substrate, and each signal transmission line may correspond to one data transmission channel. The array substrate may further include at least one impedance balancing line arranged corresponding to a signal
(Continued)

transmission line in the plurality of signal transmission lines, wherein the impedance balancing line is electrically connected to the signal transmission line, so that a difference between impedances of different data transmission channels within the fanout region meets a first predetermined condition.

17 Claims, 4 Drawing Sheets

(51) Int. Cl.
  *G02F 1/1345* (2006.01)
  *H01L 27/32* (2006.01)
(52) U.S. Cl.
  CPC .. *G09G 2300/0426* (2013.01); *H01L 27/3279* (2013.01); *H01L 2224/27831* (2013.01)
(58) Field of Classification Search
  CPC . H01L 27/124; H01L 27/3279; G02F 1/1345; G09G 2300/0426
  USPC ..... 257/52, 92, 59, 359, 620, 712, 714, 720; 438/158, 620, 712, 714, 720; 216/13, 15, 216/16
  See application file for complete search history.

(56) References Cited

U.S. PATENT DOCUMENTS

| | | |
|---|---|---|
| 2005/0206798 A1 | 9/2005 | Kim |
| 2007/0052895 A1 | 3/2007 | Chen |
| 2008/0203391 A1 | 8/2008 | Kim et al. |
| 2011/0012123 A1* | 1/2011 | Seong .................... G02F 1/1345 257/59 |
| 2011/0075089 A1* | 3/2011 | Jheng .................... G02F 1/1345 349/152 |
| 2011/0085122 A1* | 4/2011 | Fu ......................... G02F 1/13338 349/149 |
| 2011/0183479 A1* | 7/2011 | Lim ......................... H01L 27/12 438/158 |
| 2013/0147698 A1* | 6/2013 | Kang .................... G09G 3/3674 345/88 |
| 2014/0167886 A1* | 6/2014 | Na .......................... H01P 1/203 333/204 |

FOREIGN PATENT DOCUMENTS

| | | |
|---|---|---|
| CN | 102998865 A | 3/2013 |
| CN | 103022033 A | 4/2013 |
| CN | 103149753 A | 6/2013 |
| CN | 203241671 U | 10/2013 |
| CN | 103474435 A | 12/2013 |
| CN | 103560134 A | 2/2014 |
| TW | 200713408 A | 4/2007 |

OTHER PUBLICATIONS

First Office Action of Chinese application No. 201310530006.5, dated Jul. 24, 2015. Translation provided by Dragon Intellectual Property Law Firm.

Written Opinion of the International Searching Authority for international application No. PCT/CN2014/079448.

* cited by examiner

-PRIOR ART-

ARRAY SUBSTRATE, ITS MANUFACTURING METHOD, AND DISPLAY DEVICE

CROSS-REFERENCE TO RELATED APPLICATION

This application is the U.S. national phase of PCT Application No. PCT/CN2014/079448 filed on Jun. 9, 2014, which claims priority to Chinese Patent Application No. 201310530006.5 filed on Oct. 31, 2013, the disclosures of which are incorporated in their entirety by reference herein.

TECHNICAL FIELD

The present disclosure relates to the field of display technology, in particular to an array substrate, its manufacturing method and a display device.

BACKGROUND

In the related art, as shown in FIG. 1, it is required to aggregate signal transmission lines in a display panel, e.g., data lines or gate lines, within a fanout region, and then introduce the aggregated lines into several specific pad regions arranged at a periphery of the display panel, so as to carry out signal transmission with devices external to the display panel.

Distances of different signal transmission lines to the pad regions are different from each other. Within the fanout region, the signal transmission line adjacent to a periphery of the fanout region, e.g., a signal transmission line 1 as shown in FIG. 1, is the longest, and it has a maximum line resistance Rmax. However, the signal transmission line in the middle of the fanout region, e.g., a signal transmission line 3 as shown in FIG. 1, is the shortest, and it has a minimum line resistance Rmin.

The signal transmission lines with different lengths have different line resistances, so when a signal is applied thereto, there appears problems, such as signal delay among different signal transmission lines.

In the related art, usually a zigzag design is adopted, e.g., for a signal transmission line 2 and the signal transmission line 3 as shown in FIG. 1. By increasing the length of the signal transmission line at a central region of the fanout region, it is able to increase its line resistance, i.e., it is able to reduce a difference between Rmax and Rmin by increasing a value of Rmin, thereby to provide an equal-resistance design for the different signal transmission lines.

However, during an actual operation, a width of the signal transmission line is increased for the zigzag design. For example, the signal transmission line 3 in FIG. 1 is of a width of d, and the number of the signal transmission lines arranged at the pad regions will be reduced due to a limited area of the pad regions and the fanout region. Hence, it is required to provide more pad regions in the display panel so as to transmit the signal, which however results in an increase in the cost as well as the difficulty in a wiring design for the display panel.

In the case of not providing additional pad regions, it is impossible for the existing zigzag design to achieve an ideal equal-resistance design for the signal transmission lines within the fanout region due to the limited area of the pad regions and the fanout region. Usually, if Rmax/Rmin is greater than 3:1, the signal delay will probably happen, and thereby deterioration will occur.

SUMMARY

Technical Problems to be Solved

An object of the present disclosure is to provide an array substrate, its manufacturing method and a display device, so as to enable, without any additional pad regions, a ratio of resistances between signal transmission channels corresponding to respective signal transmission lines within the pad regions to be within a predetermined range, thereby to reduce the occurrence of signal delay.

Technical Solutions

In one aspect, the present disclosure provides in one embodiment an array substrate including: within its fanout region, a plurality of signal transmission lines for transmitting signals between a driver chip and a display region of the array substrate, each signal transmission line corresponding to one data transmission channel. The array substrate may further include at least one impedance balancing line arranged corresponding to a signal transmission line in the plurality of signal transmission lines. The at least one impedance balancing line may be electrically connected to the corresponding to signal transmission line, so that a difference between impedances of different data transmission channels within the fanout region meets a first predetermined condition.

In addition, the first predetermined condition may be that a difference between impedances of at least one pair of data transmission channels with arranging the at least one impedance balancing line is less than a difference between the impedances of the at least one pair of data transmission channels without arranging the at least one impedance balancing line.

In addition, the first predetermined condition may be that a difference between impedances of a data transmission channel with a maximum impedance and a data transmission channel with a minimum impedance within the fanout region with arranging the at least one impedance balancing line is less than a difference between the impedances of the data transmission channel with the maximum impedance and the data transmission channel with the minimum impedance within the fanout region without arranging the at least one impedance balancing line.

In addition, the first predetermined condition may be that a maximum difference between the impedances of the respective data transmission channels within the fanout region with arranging the at least one impedance balancing line is within a predetermined range.

In addition, the at least one impedance balancing line and the corresponding signal transmission line may be formed on different layers.

In addition, the at least one impedance balancing line may be formed from a conductive layer of the array substrate; and the conductive layer may include at least one of a pixel electrode layer, a common electrode layer, a source/drain metal layer and a gate electrode layer.

In addition, the at least one impedance balancing line may be in direct contact with the corresponding signal transmission line, or electrically connected to the corresponding signal transmission line through a via-hole.

In addition, the at least one impedance balancing line may include at least one conducting line.

In addition, the impedance balancing lines corresponding to different signal transmission lines may be of different conductive areas and/or made of different materials.

In addition, the impedance balancing lines corresponding to different signal transmission lines may be configured in such a way that:

the impedance balancing line corresponding to the signal transmission line with a larger impedance is longer; and/or the impedance balancing line corresponding to the signal transmission line with a larger impedance is of a larger cross-sectional area; and/or the impedance balancing line corresponding to the signal transmission line with a larger impedance is made of a material with smaller resistivity.

In addition, the signal transmission line may be formed from the source/drain metal layer; and the at least one impedance balancing line may be formed from the pixel electrode layer and/or the gate electrode layer.

In another aspect, the present disclosure provides in one embodiment a method for manufacturing an array substrate. The array substrate includes, within its fanout region, a plurality of signal transmission lines for transmitting signals between a driver chip and a display region of the array substrate, and each signal transmission line corresponds to one data transmission channel. The method may include steps of:

forming the plurality of signal transmission lines at predetermined positions within the fanout region of the array substrate; and forming at least one impedance balancing line on a corresponding signal transmission line in the plurality of signal transmission lines, the at least one impedance balancing line being electrically connected to the corresponding signal transmission line so that a difference between impedances of different data transmission channels within the fanout region meets a first predetermined condition.

In addition, the step of forming the at least one impedance balancing line on the corresponding signal transmission line in the plurality of signal transmission lines may include:

forming a pattern of the signal transmission lines and a layer on the signal transmission lines at the predetermined positions within the fanout region;

etching off the layer on the signal transmission lines by an etching process; and forming a pattern of the at least one impedance balancing line on a corresponding signal transmission line in the signal transmission lines.

In addition, the step of forming the at least one impedance balancing line on the corresponding signal transmission line in the plurality of signal transmission lines may include:

forming a pattern of the signal transmission lines and a layer on the signal transmission lines at the predetermined positions within the fanout region;

forming a via-hole at a predetermined position of the pattern of the signal transmission lines and/or the layer on the signal transmission lines; and forming a pattern of the at least one impedance balancing line on the layer on the signal transmission lines and at the via-hole.

In yet another aspect, the present disclosure provides in one embodiment a display device including the above-mentioned array substrate.

Advantageous Effects

The present disclosure at least has the following advantageous effects. According to the array substrate, its manufacturing method and the display device in the embodiments of the present disclosure, the array substrate may include within its fanout region the plurality of signal transmission lines for transmitting signals between the driver chip and the display region of the array substrate, and each signal transmission line may correspond to one data transmission channel. The array substrate may further include at least one impedance balancing line arranged corresponding to a signal transmission line in the plurality of signal transmission lines. The at least one impedance balancing line may be electrically connected to the corresponding signal transmission line, so that a difference between impedances of different data transmission channels within the fanout region meets a first predetermined condition. As a result, it is able to enable, without any additional pad regions, a ratio of resistances between signal transmission channels corresponding to the respective signal transmission lines within the pad regions to be within a predetermined range, thereby to reduce the occurrence of signal delay.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in one embodiment an array substrate, which includes within its fanout region a plurality of signal transmission lines 20 for transmitting signals between a driver chip and a display region of the array substrate. Each signal transmission line 20 corresponds to one data transmission channel.

Figure 1:
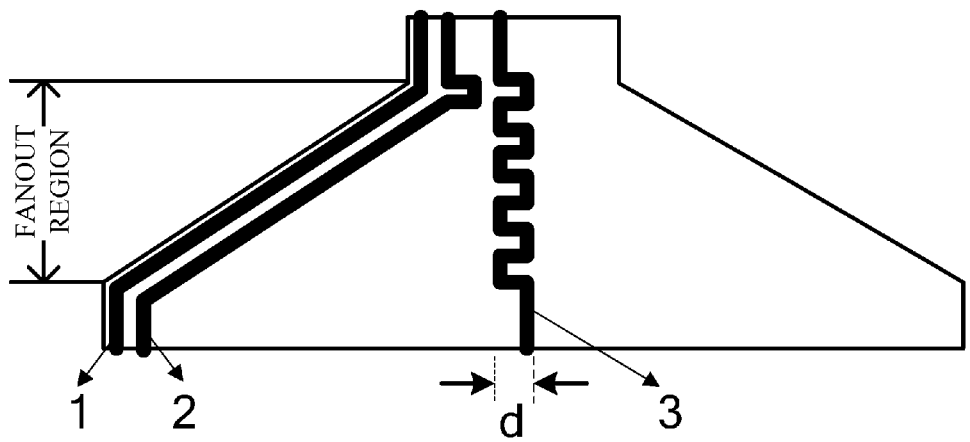
FIG. 1 is a schematic view showing an existing array substrate.
Figure 2:
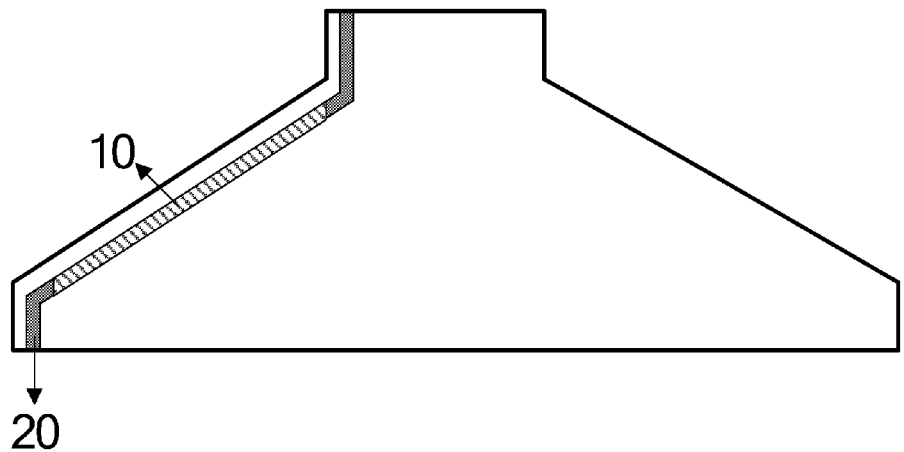
FIG. 2 is a schematic view showing an array substrate according to one embodiment of the present disclosure.

To be specific, as shown in FIG. 2, the array substrate further includes at least one impedance balancing line 10 arranged corresponding to a signal transmission line 20 in the plurality of signal transmission lines 20, wherein the impedance balancing line 10 is electrically connected to the signal transmission line 20, so that a difference between impedances of different data transmission channels within the fanout region meets a first predetermined condition.

According to the array substrate in this embodiment of the present disclosure, the impedances of the data transmission channels corresponding to different signal transmission lines may be adjusted by arranging the impedance balancing lines for the respective signal transmission lines. As a result, it is able to enable, without any additional pad regions, a ratio of resistances between the signal transmission channels corresponding to the respective signal transmission lines 20 within the fanout region to meet the first predetermined condition, thereby to reduce the occurrence of signal delay.

The first predetermined condition may be set flexibly in different embodiments. In one embodiment, for example, the first predetermined condition may be that a difference between impedances of at least one pair of data transmission channels with arranging the impedance balancing line 10 is less than a difference between the impedances of the at least one pair of data transmission channels without arranging the impedance balancing line 10.

For example, without arranging the impedance balancing line, a difference between impedances of a first data transmission channel and a second data transmission channel within the fanout region of the array substrate is 5 (with its unit being omitted), and an impedance of a first signal transmission line corresponding to the first data transmission channel is greater than an impedance of a second signal transmission line corresponding to the second data transmission channel. In this embodiment, the impedance balancing line 10 may be arranged for the first signal transmission line, so as to reduce the impedance of the first signal transmission line, e.g., by increasing its conductive area, thereby to reduce the impedance of the first data transmission channel. As a result, in the case that the impedance of the second data transmission channel is constant, the difference between the impedances of the first data transmission channel and the second data transmission channel is less than 5. Ideally, the difference between the impedances of the first data transmission channel and the second data transmission channel is equal to or near to zero.

In another embodiment, the first predetermined condition may also be that a difference between impedances of a data transmission channel with a maximum impedance and a data transmission channel with a minimum impedance within the fanout region with arranging the impedance balancing line 10 is less than a difference between the impedances of the data transmission channel with the maximum impedance and the data transmission channel with the minimum impedance within the fanout region without arranging the impedance balancing line 10.

Figure 3:
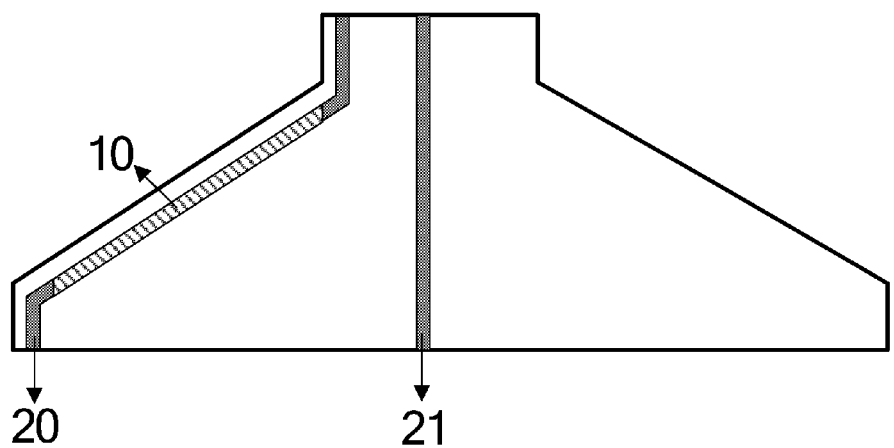
FIG. 3 is another schematic view showing the array substrate according to one embodiment of the present disclosure.

For example, as shown in FIG. 3, usually a data transmission channel corresponding to a signal transmission line 20 at a periphery of the fanout region is of the maximum impedance, and a data transmission channel corresponding to a signal transmission line 21 at a central portion of the fanout region is of the minimum impedance. Hence, in this embodiment, the impedance balancing line 10 may be arranged for the signal transmission line 20 so as to reduce the impedance of the data transmission channel corresponding to the signal transmission line 20. As a result, in the case that the impedance of the data transmission channel corresponding to the signal transmission line 21 is constant, it is able to reduce a ratio of the impedances between the data transmission channel corresponding to the signal transmission line 20 and the data transmission channel corresponding to the signal transmission line 21, and reduce the difference between the impedances of the two data transmission channels, thereby to enable the difference to be meet the first predetermined condition, e.g., to be equal to or near to zero.

In yet another embodiment, the first predetermined condition may also be that a maximum difference between the impedances of the respective data transmission channels within the fanout region with arranging the impedance balancing line 10 is within a predetermined range.

It is to be appreciated that, "maximum difference between impedances" involved herein means a difference between the impedances of two data transmission channels that have the maximum difference among differences between the impedances of any two data transmission lines.

There may exist a certain sequence for respective elements in the array substrate to be started or to execute operation steps based on a signal. Hence, in this embodiment, different impedance balancing lines 10 may be arranged for different signal transmission lines 20, so as to adjust the signal transmission time within the fanout region. Alternatively, the impedance balancing lines 10 with different impedance values may be provided so as to adjust the impedances of the signal transmission lines within the fanout region, thereby to adjust the signal transmission time in conjunction with the impedances of the original signal transmission lines in the array substrate.

In this embodiment, the signal transmission line(s) 20 for which the impedance balancing line(s) 10 is(are) to be arranged may be determined in accordance with the practical needs.

Within the fanout region, different signal transmission lines 20 have different impedances due to their lengths. In order to enable the differences between the impedances of the data transmission channels corresponding to different signal transmission lines to meet the first predetermined condition, the impedance balancing lines 10 with different conductive areas and/or made of different materials may be configured for these different signal transmission lines 20. In addition, the conductive areas may be changed by adjusting a length, width or thickness of the impedance balancing lines 10.

To be specific, an impedance of a conducting line (e.g., the impedance balancing line 10) may be affected by its conductive area. In addition, the conducting lines may have different impedances due to the conductivity of different materials. Hence, in this embodiment, the impedance of the data transmission channel may be adjusted by adjusting at least one of the length and material of the impedance balancing line 10.

In one embodiment, the impedance balancing lines corresponding to different signal transmission lines may be configured in accordance with at least one of the following principles:

the impedance balancing line corresponding to the signal transmission line with a larger impedance is longer;

the impedance balancing line corresponding to the signal transmission line with a larger impedance is of a larger cross-sectional area; and the impedance balancing line corresponding to the signal transmission line with a larger impedance is made of a material with smaller resistivity.

The above principles may be adjusted or new principles may be added in accordance with the practical needs.

The impedance balancing line 10 in this embodiment may be formed at any one conductive layer of the array substrate, e.g., at least one of a pixel electrode layer (i.e., ITO layer) 50, a common electrode layer, a source/drain metal layer 30 and a gate electrode layer 60.

In other words, the impedance balancing line 10 and the corresponding signal transmission line 20 may be formed at different layers.

The impedance balancing line 10 and the corresponding signal transmission line 20, which are formed at different layers, may be in direct contact with each other, or electrically connected to each other through a via-hole.

The present disclosure further provides in one embodiment a method for manufacturing the above array substrate, which includes steps of:

forming the plurality of signal transmission lines 20 at predetermined positions within the fanout region of the array substrate; and forming the impedance balancing line(s) 10 on the corresponding signal transmission line 20 in the plurality of signal transmission lines 20, the impedance balancing line(s) 10 being electrically connected to the corresponding signal transmission line 20 so that a difference between impedances of different data transmission channels within the fanout region meets a first predetermined condition.

In one embodiment, the step of forming the impedance balancing line(s) on the corresponding signal transmission line 20 in the plurality of signal transmission lines 20 may include:

forming a pattern of the corresponding signal transmission line 20 and a layer on the corresponding signal transmission line 20 at predetermined positions within the fanout region;

etching off the layer on the signal transmission line 20 by an etching process; and forming a pattern of the impedance balancing line(s) 10 on the corresponding signal transmission line 20.

In this embodiment, the impedance balancing line(s) 10 is(are) in direct contact with the corresponding signal transmission line 20, so as to achieve the electrical connection therebetween.

Figure 4:
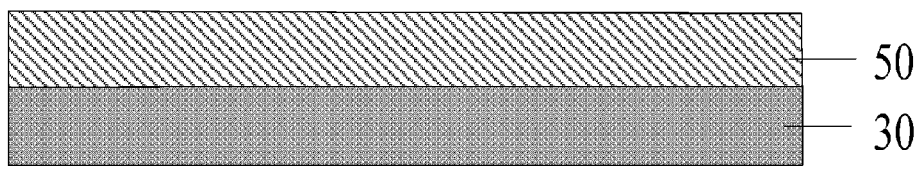
FIG. 4 is yet another schematic view showing the array substrate according to one embodiment of the present disclosure.

To be specific, as shown in FIG. 4, the source/drain metal layer 30 may be deposited on an existing pattern (e.g., the gate electrode layer 60 or a gate insulating layer 70), so as to form a pattern of the signal transmission line 20 by a patterning process. Then, a pattern of a passivation layer 40 may be formed on the signal transmission line 20. In a via-hole etching process, the passivation layer 40 may be etched off from the signal transmission line 20 at the periphery of the fanout region by modifying a mask structure. And then, a pattern of the pixel electrode (ITO) layer 50 may be directly formed on the exposed signal transmission line 20, so as to serve as the impedance balancing line 10 for the signal transmission line 20. The ITO layer 50 is conductive, so the conductive area of the corresponding signal transmission line 20 increases due to the pattern of the ITO layer 50. This principle is similar to a situation where a total resistance of a plurality of resistors, with being connected in parallel, is less than a resistance of each resistor. As a result, it is able to effectively reduce a line resistance of the signal transmission line 20 at the periphery of the fanout region, thereby to reduce the impedance of the data transmission channel at the periphery of the fanout region.

In this embodiment, whether or not to form the pattern of the ITO layer 50, i.e., the impedance balancing line 10, and parameters thereof, e.g., length, may be determined in accordance with a position and a length of each signal transmission line 20. For example, in FIG. 3, the impedance balancing line 10 arranged for the signal transmission line 20 is the longest. Then, the lengths of the impedance balancing lines 10 arranged for the respective signal transmission lines 20 may be reduced gradually in a direction toward a center of the fanout region (i.e., in a direction toward the signal transmission line 21 as shown in FIG. 3) (provided that the patterns of the ITO layer 50, i.e., the impedance balancing lines 10, arranged for all the signal transmission lines 20 within the fanout region are made of the same material). The signal transmission line 20 in FIG. 3 is the shortest, so no impedance balancing line 10 is arranged for it. A general object of this embodiment of the present disclosure is to reduce the impedances, i.e., resistances, of the signal transmission lines at the periphery of the fanout region in a stepwise manner, so that a ratio of the impedances of the data transmission channels corresponding to the respective signal transmission lines 20 within the fanout region is within a predetermined range, e.g., the ratio is 1 or near to 1.

The impedance balancing line at the ITO layer 50 may be etched into stripes, so in one embodiment, the impedance balancing line 10 may include at least one conductive line.

In the above embodiment, the description is given by taking the signal transmission line 20 formed from the source/drain metal layer 30 (SD layer) and the impedance balancing line 10 formed from the ITO layer 50 as an example. However, in the actual application, the pattern of the signal transmission line 20 may also be formed from the gate electrode layer 60, the gate insulating layer 70 may be etched off from the signal transmission line 20, and then the source/drain metal layer 30 may be directly applied onto the exposed signal transmission signal 20, i.e., the impedance balancing line 10 may be formed from the source/drain metal layer 30.

The above description is given on the basis of the formation of the impedance balancing line 10 on one layer. Further, the pattern of the impedance balancing line 10 may be formed on several layers, and the impedance balancing line 10 may be in direct contact with the signal transmission line 20 on the gate electrode layer 60 so as to achieve the electrical connection therebetween.

For example, the signal transmission lines 20 are formed from the gate electrode layer 60 and a first impedance balancing line is formed from the source/drain metal layer 30. In a subsequent process, the passivation layer 40 on the first impedance balancing line may be etched off, and then the first impedance balancing line is directly covered with a second impedance balancing line formed from the ITO layer 50. As a result, the first impedance balancing line and the second impedance balancing line are combined to form the impedance balancing line 10 corresponding to the signal transmission line 20. In this embodiment, the impedance balancing line 10 may include different conducting lines formed on different layers, so it is able to remarkably increase the conductive area of the signal transmission line 20, thereby to remarkably reduce, e.g., by more than 50%, the impedance of the data transmission channel corresponding to the signal transmission line 20.

In another embodiment, the step of forming the impedance balancing line(s) on the corresponding signal transmission line 20 in the plurality of signal transmission lines 20 may also include:

forming a pattern of the corresponding signal transmission line 20 and a layer on the corresponding signal transmission line 20 at predetermined positions within the fanout region;

forming a via-hole at a predetermined position of the pattern of the corresponding signal transmission line 20 and/or the layer on the corresponding signal transmission line 20; and forming a pattern of the impedance balancing line(s) on the layer on the signal transmission line and at the via-hole.

In this embodiment, it is able to electrically connect the impedance balancing line(s) 10 and the corresponding signal transmission line 20 through the via-hole.

In the embodiments of the present disclosure, there are various modes for electrically connecting the impedance balancing line(s) 10 and the corresponding signal transmission line 20 through the via-hole. The following description is given by taking a bottom-gate array substrate as an example.

In one embodiment, the signal transmission line 20 and the impedance balancing line(s) 10 formed at several layers may be connected to each other by means of the uppermost conductive layer of the array substrate.

To be specific, if the signal transmission line(s) 20 is(are) formed from the source/drain metal layer 30, a reserved metal line of the gate electrode layer 60 may be formed as the impedance balancing line 10 on the gate electrode layer 60 at a position corresponding to the signal transmission line 20 by using existing technologies and processes while forming a gate line and a common electrode line on the gate electrode layer 60. If the signal transmission line 20 is formed from the gate electrode layer 60, a reserved source/drain metal line may also be formed as the impedance balancing line 10 at a position corresponding to the signal transmission signal 20 (which is formed from the gate electrode layer 60) while forming a source/drain metal line (i.e., a data line) on the source/drain metal layer 30.

Then, the via-hole is formed at a predetermined position and on a predetermined layer by a via-hole etching process.

Finally, more than two conductive layers (including the impedance balancing line 10 and the signal transmission line 20) may be electrically connected to each other through the via-hole by means of the uppermost conductive layer, i.e., the conductive layer that is formed at last, of the array substrate, e.g., the pattern of the ITO layer 50. At this time, the uppermost conductive layer itself may be a part of the impedance balancing line 10.

As a feature of this scheme, it is able to reduce the impedance of the data transmission channel by means of the existing process, without adding a mask plate.

The procedure of connecting the signal transmission line 20 and the impedance balancing line 10 on several layers by means of the uppermost conductive layer of the array substrate may be described hereinafter with respect to different schemes for the via-hole etching process.

First Scheme

Figure 5:
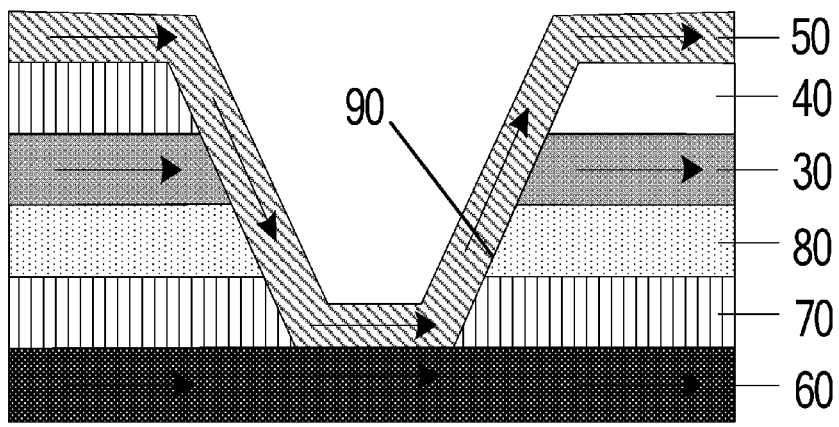
FIG. 5 is still yet another schematic view showing the array substrate according to one embodiment of the present disclosure.

In this scheme, a 4 mask process for manufacturing the array substrate is taken as an example. During a mask process for source/drain electrodes (SDT), a photoresist is not reserved at a via-hole 90 (as shown in FIG. 5). In this way, after the SDT etching process, the source/drain metal layer 30 and an active layer 80 at a position corresponding to the via-hole 90 are etched off. After the removal of the passivation layer 40, the via-hole 90 is formed at this position. In this embodiment, the passivation layer 40 and the gate insulating layer 70 at a position corresponding to the via-hole 90 may be etched off by a common etching process. By depositing the ITO layer 50 subsequently, it is able to achieve the electrical connection between the signal transmission line 20 and the impedance balancing line 10 formed from the source/drain metal layer 30 and the gate electrode layer 60, respectively.

It should be appreciated that, when etching the via-hole 90, it is required to etch off the passivation layer 40 at a side wall of the via-hole 90. In this way, after depositing the ITO layer 50, it is able to connect the signal transmission line 20 and the impedance balancing line 10 on different layers through the ITO layer 50 deposited on the side wall of the via-hole 90.

If the pattern of the ITO layer 50 at the top is reserved, the data transmission channel includes three conductive layers. At this time, the signal transmission line 20 is formed from the source/drain metal layer 30 and the impedance balancing line 10 is formed from the gate electrode layer 60 and the ITO layer 50, or the signal transmission line 20 is formed from the gate electrode layer 60 and the impedance balancing line is formed from the source/drain metal layer 30 and the ITO layer 50. On the other hand, if the pattern of the ITO layer 50 at the top is not reserved, the ITO layer 50 is merely deposited on the side wall of the via-hole 90 and it merely functions as to electrically connect the signal transmission line 20 and the impedance balancing line 10. The data transmission channel includes two conductive layers. At this time, the signal transmission line 20 is formed from the source/drain metal layer 30 and the impedance balancing line 10 is formed from the gate electrode layer 60, or the signal transmission line 20 is formed from the gate electrode layer 60 and the impedance balancing line 10 is formed from the source/drain metal layer 30.

FIG. 5 shows the array substrate manufactured by this scheme.

Second Scheme

In this scheme, if the via-hole is not etched in the SDT mask process, a via-hole 91 (not shown, which is different from the via-hole 90) at a position where the drain electrode is connected to the pixel electrode at a pixel region may be subject to half exposure and the via-hole 90 may be subject to full exposure in a normal etching process. As a result, when the via-hole 90 is etched by means of full exposure until it reaches the gate electrode layer 60, the via-hole 91 at the position where the drain electrode is connected to the pixel electrode can also be formed within one mask process.

To be specific, after the via-hole mask process, the photoresist still remains at the via-hole 91 (i.e., the via-hole 91 is subject to half exposure), but there is no photoresist at the via-hole 90. The etching process includes:

etching off the passivation layer 40 at the via-hole 90 by dry etching;

etching off the source/drain metal layer 30 at the via-hole 90 by wet etching;

etching off the active layer 80 at the via-hole 90 by dry etching;

etching off the photoresist at the via-hole 91 by an ashing process; and etching off the passivation layer 40 at the via-hole 91, the gate insulating layer 70 at the via-hole 90, and the passivation layer 40 and the gate insulating layer 70 within the fanout region by a second via-hole etching process which is identical to a conventional via-hole etching process.

Similar to the first scheme, after the etching, the signal transmission line 20 and the impedance balancing line 10 on different layers are connected to each other by means of the deposited ITO layer 50. The ITO layer 50 may be reserved so as to form a structure consisting of three conductive layers, or merely the ITO layer 50 at the positions corresponding to the via-holes is reserved so as to form a structure consisting of two conductive layers. In this way, it is able to form such a via-hole structure that the ITO layer 50 is connected to the drain electrode at the via-hole 91 while the signal transmission line 20 is connected to the impedance balancing line 10 by means of the ITO layer 50 at the via-hole 90.

In a traditional via-hole etching process, it is merely required to etch off the passivation layer 40 connecting the drain electrode and the pixel electrode at the pixel region, and the passivation layer 40 and the gate insulating layer 70 within the fanout region, so in this embodiment, it is fully able to etch off the gate insulating layer 70 at the via-hole 90 by the second via-hole etching process in principle and in practice.

According to this scheme, it is able to directly etch the via-holes with different functions simultaneously within one mask process.

FIG. 5 also shows the array substrate manufactured by this scheme.

In another embodiment of the present disclosure, several via-hole etching processes may also be adopted, so as to achieve the electrical connection between the signal transmission line 20 and the impedance balancing line 10 on different layers.

Figure 6:
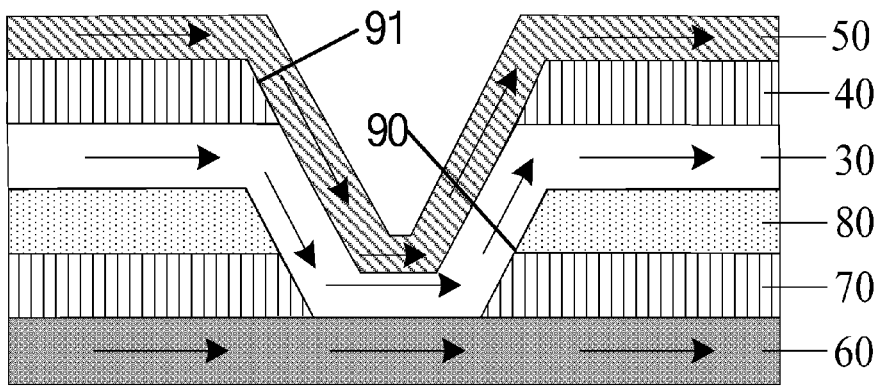
FIG. 6 is still yet another schematic view showing the array substrate according to one embodiment of the present disclosure.

For example, as shown in FIG. 6, a mask process is added after depositing the active layer 80, so as to form the via-hole 90 in the active layer 80 and the gate insulating layer 70 for connecting the gate electrode layer 60 and the source/drain metal layer 30. Then, the pattern of the source/drain metal layer 30 (the signal transmission line 20 or the impedance balancing line 10) is formed by a patterning process. Because the side wall of the via-hole 90 is covered with the source/drain metal layer 30, it is able to achieve the electrical connection between the gate electrode layer 60 and the source/drain metal layer 30.

Then, the passivation layer 40 is applied onto the source/drain metal layer 30, and the via-hole 91 is formed in the passivation layer 40 at a position corresponding to the via-hole 90 by an additional mask process. Next, the ITO layer 50 is applied at the via-hole 91 and onto the passivation layer 40, so as to achieve the electrical connection among the gate electrode layer 60, the source/drain metal layer 30 and the ITO layer 50, thereby to form a structure consisting of three conductive layers.

Although with an additional mask process in this embodiment (after depositing the active layer 80, an additional mask process is provided and the via-hole 91 is etched by dry etching), it is able to reduce a ramp height of the ITO layer 50, thereby to improve the reliability of the process as well as a product yield.

In yet another embodiment of the present disclosure, the array substrate may be obtained by combining the technical solutions as shown in FIGS. 4 and 5.

Figure 7:
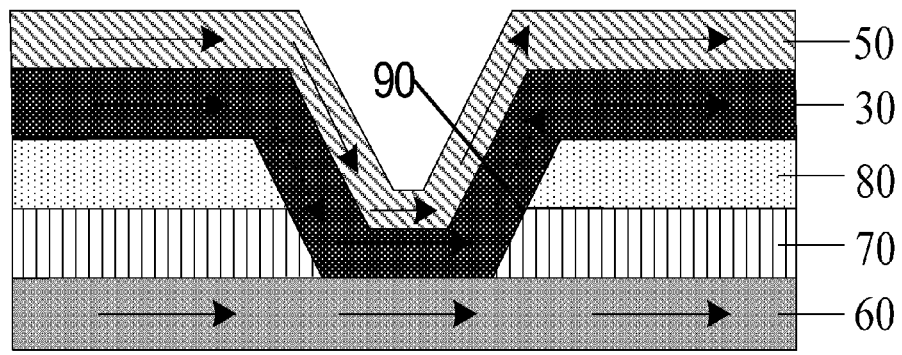
FIG. 7 is still yet another schematic view showing the array substrate according to one embodiment of the present disclosure.
Figure 8:
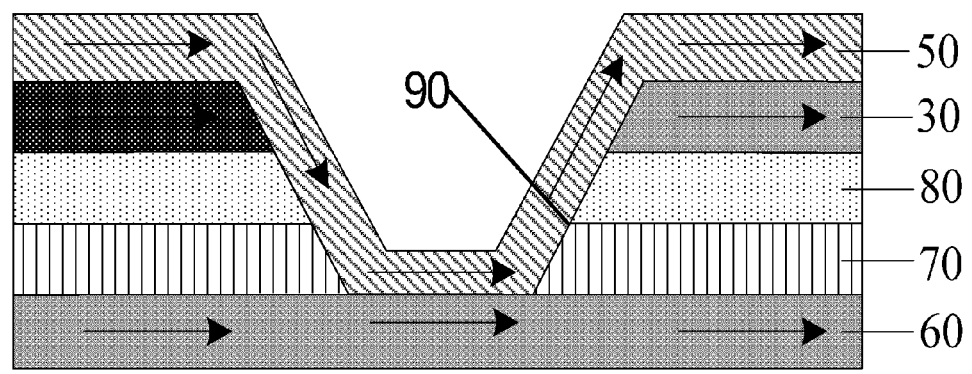
FIG. 8 is still yet another schematic view showing the array substrate according to one embodiment of the present disclosure.

To be specific, as shown in FIGS. 7 and 8, when etching the via-holes, the passivation layer 40 and a part of the gate insulating layer 70 at a position corresponding to the signal transmission line 20 are etched off, so as to form a stripe-like, shallow groove. Then, the ITO layer 50 is deposited into the groove, so as to enable the electrical connection between the signal transmission line 20 and the impedance balancing line 10 on different layers. In this way, the ITO layer 50 can be in direct contact with the source/drain metal layer 30, so as to improve the reliability of the process as well as the product yield.

The present disclosure further provides in one embodiment a display device including the above-mentioned array substrate. The display device may be a liquid crystal panel, a liquid crystal TV, a liquid crystal display (LCD), an organic light-emitting diode (OLED) panel, an OLED display, a plasma display or an electronic paper.

According to the array substrate, its manufacturing method and the display device in the embodiments of the present disclosure, the array substrate includes within its fanout region the plurality of signal transmission lines for transmitting signals between the driver chip and the display region of the array substrate, and each signal transmission line corresponds to one data transmission channel. The array substrate further includes at least one impedance balancing line arranged corresponding to a signal transmission line in the plurality of signal transmission lines. The impedance balancing line is electrically connected to the signal transmission line, so that a difference between impedances of different data transmission channels within the fanout region meets a first predetermined condition. As a result, it is able to enable, without any additional pad regions, a ratio of resistances between signal transmission channels corresponding to the respective signal transmission lines at the pad regions to be within a predetermined range, thereby to reduce the occurrence of signal delay.

Meanwhile, according to the embodiments of the present disclosure, it is able to reduce a width of the signal transmission line, thereby to provide more signal transmission lines within a pad region, reduce the number of the pad regions in the display panel and provide a narrow bezel design. In addition, one driver circuit is provided at a small region so as to drive the signal transmission lines as many as possible, and as a result, it is able to reduce the number of the driver circuits, thereby to reduce the production cost of the display panel.

Furthermore, according to the embodiments of the present disclosure, an existing zigzag design may be adopted at the same time, so as to enable the difference between the impedances of the data transmission channels to meet the predetermined condition.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. An array substrate, comprising:
a fanout region including a plurality of signal transmission lines for transmitting signals between a driver chip and a display region of the array substrate, each signal transmission line corresponding to one data transmission channel; and
at least one impedance balancing line arranged corresponding to a signal transmission line of the plurality of signal transmission lines,
wherein the at least one impedance balancing line is electrically connected to the corresponding signal transmission line;
the at least one impedance balancing line comprises a plurality of conductive lines formed on different layers, and each of the plurality of conductive lines is in direct contact with the corresponding signal transmission line;
the at least one impedance balancing line as well as a direct contact part between the at least one impedance balancing line and the corresponding signal transmission line are arranged within the fanout region; and
an orthographic projection of the at least one impedance balancing line on the array substrate overlaps at least one of partially or completely another orthographic projection of the direct contact part between the at least one impedance balancing line and the corresponding signal transmission line on the array substrate.

2. The array substrate according to claim 1, wherein a difference between impedances of at least one pair of data transmission channels with arranging the at least one impedance balancing line is less than a difference between the impedances of the at least one pair of data transmission channels without arranging the at least one impedance balancing line.

3. The array substrate according to claim 1, wherein a difference between impedances of a data transmission channel with a maximum impedance and a data transmission channel with a minimum impedance within the fanout region with arranging the at least one impedance balancing line is less than a difference between the impedances of the data transmission channel with the maximum impedance and the data transmission channel with the minimum impedance within the fanout region without arranging the at least one impedance balancing line.

4. The array substrate according to claim 1, wherein a maximum difference between the impedances of the respective data transmission channels within the fanout region with arranging the at least one impedance balancing line is below a threshold.

5. The array substrate according to claim 1, wherein the at least one impedance balancing line and the corresponding signal transmission line are formed on different layers.

6. The array substrate according to claim 1, wherein the impedance balancing lines corresponding to different signal transmission lines are of different conductive areas and/or made of different materials.

7. The array substrate according to claim 1, wherein the impedance balancing lines corresponding to different signal transmission lines are configured such that at least one of:
(i) the impedance balancing line corresponding to the signal transmission line with a larger impedance is longer; (ii) the impedance balancing line corresponding to the signal transmission line with a larger impedance is of a larger cross-sectional area; or
(iii) the impedance balancing line corresponding to the signal transmission line with a larger impedance is made of a material with smaller resistivity.

8. The array substrate according to claim 1, wherein the at least one impedance balancing line is formed from a conductive layer of the array substrate; and the conductive layer includes at least one of a pixel electrode layer, a common electrode layer, a source/drain metal layer and a gate electrode layer.

9. The array substrate according to claim 8, wherein the signal transmission line is formed from the source/drain metal layer; and the at least one impedance balancing line is formed from at least one of the pixel electrode layer or the gate electrode layer.

10. A method for manufacturing an array substrate, the array substrate including a fanout region, the fanout region including a plurality of signal transmission lines for transmitting signals between a driver chip and a display region of the array substrate, each signal transmission line corresponding to one data transmission channel, the method comprising:
forming the plurality of signal transmission lines at predetermined positions within the fanout region of the array substrate; and
forming at least one impedance balancing line on a corresponding signal transmission line of the plurality of signal transmission lines, the at least one impedance balancing line being electrically connected to the corresponding signal transmission line;
wherein the at least one impedance balancing line comprises a plurality of conductive lines formed on different layers, and each of the plurality of conductive lines is in direct contact with the corresponding signal transmission line;
the at least one impedance balancing line as well as a direct contact part between the at least one impedance balancing line and the corresponding signal transmission line are arranged within the fanout region; and
an orthographic projection of the at least one impedance balancing line on the array substrate overlaps at least one of partially or completely another orthographic projection of the direct contact part between the at least one impedance balancing line and the corresponding signal transmission line on the array substrate.

11. The method according to claim 10, wherein forming the at least one impedance balancing line on the corresponding signal transmission line in the plurality of signal transmission lines further comprises:
forming a layer on the signal transmission lines;
etching the layer on the signal transmission lines by an etching process; and
forming a pattern of the at least one impedance balancing line on a corresponding signal transmission line in the signal transmission lines.

12. A display device comprising an array substrate, the array substrate comprising:
a fanout region including a plurality of signal transmission lines for transmitting signals between a driver chip and a display region of the array substrate, each signal transmission line corresponding to one data transmission channel; and
at least one impedance balancing line arranged corresponding to a signal transmission line of the plurality of signal transmission lines,
wherein the at least one impedance balancing line is electrically connected to the corresponding signal transmission line;

the at least one impedance balancing line comprises a plurality of conductive lines formed on different layers, and each of the plurality of conductive lines is in direct contact with the corresponding signal transmission line;

the at least one impedance balancing line as well as a direct contact part between the at least one impedance balancing line and the corresponding signal transmission line are arranged within the fanout region; and an orthographic projection of the at least one impedance balancing line on the array substrate overlaps at least one of partially or completely another orthographic projection of the direct contact part between the at least one impedance balancing line and the corresponding signal transmission line on the array substrate.

13. The display device according to claim 12, wherein a difference between impedances of at least one pair of data transmission channels after arranging the at least one impedance balancing line is less than a difference between the impedances of the at least one pair of data transmission channels before arranging the at least one impedance balancing line.

14. The display device according to claim 12, wherein a difference between impedances of a data transmission channel with a maximum impedance and a data transmission channel with a minimum impedance within the fanout region after arranging the at least one impedance balancing line is less than a difference between the impedances of the data transmission channel with the maximum impedance and the data transmission channel with the minimum impedance within the fanout region before arranging the at least one impedance balancing line.

15. The display device according to claim 12, wherein a maximum difference between the impedances of the respective data transmission channels within the fanout region after arranging the at least one impedance balancing line is within a predetermined range.

16. The display device according to claim 12, wherein the at least one impedance balancing line and the corresponding signal transmission line are formed on different layers.

17. The display device according to claim 12, wherein the at least one impedance balancing line is formed on a conductive layer of the array substrate; and the conductive layer includes at least one of a pixel electrode layer, a common electrode layer, a source/drain metal layer and a gate electrode layer.

* * * * *